United States Patent
Shimbayashi

(10) Patent No.: US 6,965,530 B2
(45) Date of Patent: Nov. 15, 2005

(54) SEMICONDUCTOR MEMORY DEVICE AND SEMICONDUCTOR MEMORY DEVICE CONTROL METHOD

(75) Inventor: Koji Shimbayashi, Aizuwakamatsu (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/029,454

(22) Filed: Jan. 6, 2005

(65) Prior Publication Data

US 2005/0117446 A1 Jun. 2, 2005

Related U.S. Application Data

(63) Continuation of application No. PCT/JP03/14768, filed on Nov. 19, 2003.

(30) Foreign Application Priority Data

Dec. 26, 2002 (JP) .............................. 2002-377039

(51) Int. Cl.$^7$ ............................................... G11C 7/00
(52) U.S. Cl. .................. 365/189.05; 365/195; 365/233
(58) Field of Search ........................... 365/189.05, 194, 365/195, 233

(56) References Cited

U.S. PATENT DOCUMENTS

| | | | |
|---|---|---|---|
| 5,798,969 A * | 8/1998 | Yoo et al. ............. | 365/189.05 |
| 5,886,948 A * | 3/1999 | Ryan ........................... | 365/233 |
| 5,905,678 A * | 5/1999 | Pascucci ................. | 365/189.05 |
| 6,049,488 A * | 4/2000 | Sawada .................. | 365/189.05 |
| 6,205,084 B1 | 3/2001 | Akaogi ....................... | 365/233 |
| 6,249,461 B1 | 6/2001 | Choi et al. ............. | 365/185.33 |
| 6,643,215 B2 * | 11/2003 | Kwak ......................... | 365/233 |

FOREIGN PATENT DOCUMENTS

| JP | 09106682 A * | 4/1997 | ......... G11C 11/409 |
|---|---|---|---|
| WO | WO 01/75898 A2 | 10/2001 | |

* cited by examiner

Primary Examiner—Tan T. Nguyen
(74) Attorney, Agent, or Firm—Arent Fox PLLC

(57) ABSTRACT

A semiconductor memory device wherein, in continuous data reading, a notification signal to notify whether a suspend mode is entered or not is given synchronously with data output control according to an output control signal with a suspend function, and a method of controlling the device. When an output enable signal is also used as a suspend instruction, a synchronizing circuit synchronizes the output enable signal with a clock signal to output a synchronized output enable signal. This synchronized output enable signal is supplied to a ready control circuit and an output buffer circuit so that the output control of data and ready signal is performed in synchronization with the clock signal. A data terminal goes into a high impedance state in synchronization with the clock signal, which notifies transition to the suspend mode. This quickly notifies that the system bus has become open.

8 Claims, 5 Drawing Sheets

SEMICONDUCTOR MEMORY DEVICE AND SEMICONDUCTOR MEMORY DEVICE CONTROL METHOD

CROSS-REFERENCE TO RELATED APPLICATIONS

This application is a continuation application based upon and claims the benefit of the prior PCT International Patent Application No. PCT/JP2003/014768 filed on Nov. 19, 2003, the entire contents of which are incorporated herein by reference.

BACKGROUND OF THE INVENTION

1. Field of the Invention

The present invention relates to control of continuous data reading in a semiconductor memory device and more particularly to a semiconductor memory device which performs data output control and judgment of output data validity when suspend and resume functions are used during continuous data reading, and a method of controlling the same.

2. Description of Related Art

Conventionally, in semiconductor memory devices, continuous data reading operation (burst mode, etc) has been performed in order to transmit data to a system controller (processor, etc) through a system bus at high speed. In this type of system, plural devices including a semiconductor memory device are connected with the system bus and an individual device occupies the system bus for data access and is switched to another device as necessary. When a semiconductor memory device is reading data continuously while occupying the system bus, it may become necessary for the device to surrender the system bus to another device temporarily upon a request from the system controller, etc. In order to cope with such a situation, the semiconductor memory device has a suspend function, a function of stopping continuous reading operation temporarily.

Some suspend functions are performed by stopping supply of external clock signals to stop internal circuit operation. However, for system operation, it is not desirable to stop clock signals to be supplied to the whole system, in order to perform the suspend function of the semiconductor memory device.

In a burst mode flash memory disclosed in Japanese unexamined patent publication No. 2001-176277, paragraphs 0016, 0017, 0063 and 0066, FIGS. 1 and 12, an output enable buffer 210 receives an external output enable signal 210a as shown in FIG. 9. The external output enable signal 210a is sent by a processor through a system bus. In response to the external output enable signal 210a, the output enable buffer 210 generates an internal output enable signal 210b. The internal output enable signal 210b is sent to a burst suspend part 121. In the burst suspend part 121, a clock enable signal COEB is outputted to a clock buffer 300. The clock buffer 300 controls a buffer clock signal CLKB which is synchronized with an external clock signal CLKESDR in response to the clock enable signal COEB. During continuous data reading in which a buffer clock signal CLKB is to be generated to enable internal operation, the supply of a buffer clock signal CLKB is stopped and data output is prohibited or disabled in the suspend mode.

The internal output enable signal 210b is also sent to an output buffer 190. As shown in FIG. 10, in the output buffer 190, a latch 607a which receives read data (Data) is connected with one input of a NOR gate 609a and one input of a NAND gate 611a. The other input of the NOR gate 609a is connected with the internal output enable signal 210b. The other input of the NAND gate 611a is connected with an inverter 603b which receives the internal output enable signal 210b as an input. The data is outputted through an output signal OUT when the internal output enable signal 210b is "low."

On the other hand, in the burst mode flash memory disclosed by Japanese unexamined patent publication No. 2001-176277, while a system controller (not shown) acquires data from a system bus (not shown) in synchronization with an external clock signal CLKESDR, data output from the output buffer 190 which is stopped by a suspend function is performed according to the internal output enable signal 210b asynchronously with the external clock signal CLKESD. When the external output enable signal 210a is inputted asynchronously with the external clock signal CLKESDR, the time of prohibition of data output from the output buffer 190 fluctuates before or after the next cycle of the external clock signal CLKESDR depending on the time of transition of the external output enable signal 210a. The problem here is that the time of prohibition of output data upon entry into the suspend mode cannot be uniquely determined.

In order to determine the time of prohibition uniquely, data output must be prohibited before start of the next cycle even if transition of the external output enable signal 210a is delayed until the setup time of the external clock signal CLKESDR. The setup time must be longer than the internal circuit delay time from transition of the external output enable signal 210a until prohibition of output data. This would put a limit on shortening of the external clock signal CLKESDR cycle, making it impossible to cope with high speed operation.

Also, for effective use of the system bus, it is desirable that switching between devices which access data be quickly done and the system controller should quickly detect that the system bus has become open (unoccupied). However, Japanese unexamined patent publication No. 2001-176277 does not disclose a notification signal which notifies that the suspend mode is entered through an external output enable signal 210a from the system controller and data output is prohibited. The problem here is that the system controller cannot detect the time of suspend mode entry through the external output enable signal 210a and may fail to allocate the system bus, which is opened, to another device quickly.

In addition, if switching is done too early, output data may still be not prohibited. If that should be the case, a bus fight might occur and reliability of data might not be assured.

SUMMARY OF THE INVENTION

The present invention has been made to solve at least one problem of the prior art and provides a semiconductor memory device in which data output control is synchronized with an external control signal according to an output control signal, which functions as a data output control instruction and provides a suspend/resume function for continuous data reading, and also a notification signal, which notifies whether the suspend mode is entered or not, is synchronously controlled, and a method of controlling the semiconductor memory device.

In order to achieve the above objects, according to one aspect of the present invention, a semiconductor memory device continuously outputs data in synchronization with an external control signal and includes: an output control terminal which receives an output control signal which functions as both a data output control instruction and a suspend instruction for continuous data output; a synchronizing circuit, connected with the output control terminal, which acquires the output control signal in synchronization with the external control signal and outputs the acquired signal as a synchronized output control signal; and an output buffer circuit which synchronously controls whether to enable or disable data output according to the synchronized output control signal.

In the above semiconductor memory device, the synchronization circuit receives, through the output control terminal, the output control signal which functions as both a data output control instruction and a suspend instruction for continuous data output. The synchronization circuit outputs the output control signal synchronized with an external control signal as a synchronized output control signal. The output buffer circuit controls whether to enable or disable data output according to the synchronized output control signal and thus the data output enabled state or disabled state is set in synchronization with the external control signal.

According to another aspect of the invention, a semiconductor memory device control method includes, for a semiconductor memory device which continuously outputs data in synchronization with an external control signal, the steps of: acquiring an output control signal which functions as both a data output control instruction and a suspend instruction for continuous data output, in synchronization with the external control signal; and synchronously controlling whether to enable or disable data output according to the acquired output control signal.

In the above semiconductor memory device control method, in the signal synchronization step, the output control signal which functions as both a data output control instruction and a suspend instruction for continuous data output is acquired in synchronization with the external control signal. In the data output synchronization control step, whether to enable or disable data output is synchronously controlled according to the acquired output control signal and thus the data output enabled state or disabled state is set in synchronization with the external control signal.

Therefore, even when an output control signal is entered asynchronously with an external control signal and an instruction to start or end the suspend mode is given asynchronously with the external control signal, transition from the data output enabled state to the data output disabled state or vice versa is synchronized with the external control signal. Data output enabled and disabled states are switched at the time of input of an external control signal which is uniquely determined by a suspend instruction through an output control signal, so that quick and stable operation is assured. Control in synchronization with the external control signal assures stable operation even when the external control signal operation cycle is sped up.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Next, preferred embodiments of the present invention concerning a semiconductor memory device and a semiconductor memory device control method will be described in detail referring to FIGS. 1 to 8.

Figure 1:
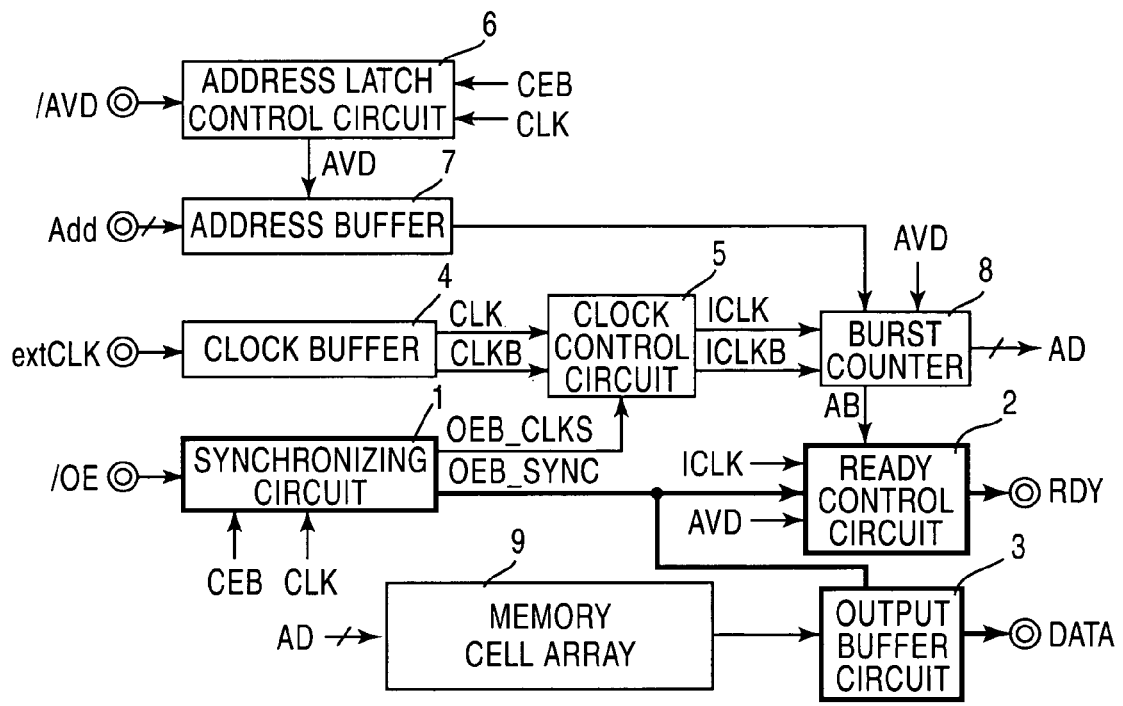
FIG. 1 is a circuit block diagram showing an embodiment of the present invention.

FIG. 1 is a block diagram which shows a synchronous semiconductor memory device according to an embodiment of the present invention. In a semiconductor memory device shown in FIG. 1, a burst counter 8 continuously reads data from a memory cell array 9 according to internal addresses AD generated sequentially in synchronization with internal clock signals ICLK and ICLKB (burst reading).

The burst counter 8 receives an address latch signal AVD from an address latch control circuit 6 connected with an address latch terminal (/AVD) and also an initial address Add from an address terminal (Add) through an address buffer 7. The address latch control circuit 6 is activated by a chip enable signal CEB and synchronized with a clock signal CLK to output an address latch signal AVD. The address buffer 7 is activated by the address latch signal AVD to receive the initial address Add to be supplied to the burst counter 8. The address latch signal AVD is also supplied to a ready control circuit 2 (stated later).

An external clock signal extCLK is sent through an external clock terminal (extCLK) to a clock buffer 4. From the clock buffer 4, clock signals CLK and CLKB are supplied to a clock control circuit 5, a synchronizing circuit 1, and an address latch control circuit 6.

The clock control circuit 5 uses clock signals CLK and CLKB from the clock buffer 4 to control supply of internal clock signals ICLK and ICLKB according to the suspend mode which is controlled by an output enable signal /OE for burst reading. When the suspend mode is entered, supply of internal clock signals ICLK and ICLKB is stopped by an internal clock control signal OEB_CLKS (stated later). Since the internal clock signals ICLK and ICLKB are sent to the burst counter 8 and used as address change timing signals for burst reading, continuous data reading operation is prohibited when supply of internal clock signals ICLK and ICLKB is stopped. The internal clock signals ICLK and ICLKB are also supplied to the ready control circuit 2 (stated later).

In the present invention, the output enable signal /OE, which controls whether to enable or disable data output from the output buffer circuit 3, is also used as a suspend instruction. The output enable terminal (/OE) is connected with the synchronizing circuit 1. The synchronizing circuit 1 is activated by a chip enable signal CEB to receive an output enable signal /OE entered asynchronously with an external clock signal extCLK. The synchronizing circuit 1 outputs an internal clock control signal OEB_CLKS which stops the internal clock signals ICLK and ICLKB in the suspend mode, and also synchronizes the output enable signal /OE with the clock signal CLK to output asynchronized output enable signal OEB_SYNC. The synchronized output enable signal OEB_SYNC is supplied to the ready control circuit 2 and output buffer circuit 3.

The output buffer circuit 3 outputs data which is read from the memory cell array 9 depending on the internal address AD. Subject to the control of the synchronized output enable signal OEB_SYNC, when the output buffer circuit 3 receives an output enable signal /OE as a suspend instruction for entry into the suspend mode, data output is prohibited or disabled synchronously with a subsequent clock signal CLK. In the state in which data output is disabled, a data terminal (DATA) goes into a high impedance state and disables data output to the system bus to make the bus open. As a consequence, the system bus can be connected with another device.

The ready control circuit 2 is controlled by the synchronized output enable signal OEB_SYNC in the same way as the output buffer circuit 3. When the ready control circuit 2 receives an output enable signal /OE as a suspend instruction for entry into the suspend mode and a data terminal (DATA) goes into a high impedance state synchronously with a subsequent clock signal CLK, the ready control circuit 2 outputs a ready signal RDY. The ready signal RDY is a notification signal which notifies the system controller (not shown) that the semiconductor memory device has entered the suspend mode. Upon receipt of the ready signal RDY, the system controller acknowledges that the data terminal (DATA) is disconnected from the system bus.

The ready control circuit 2 receives an address boundary signal AB from the burst counter 8. The address boundary signal AB is a signal which is generated when active areas in the circuit configuration of the memory cell array 9 are changed (change of word lines, etc) depending on the address count of the burst counter 8. Since additional access time is needed to change active areas, the time to control output of a ready signal RDY should be adjusted.

Figure 2:
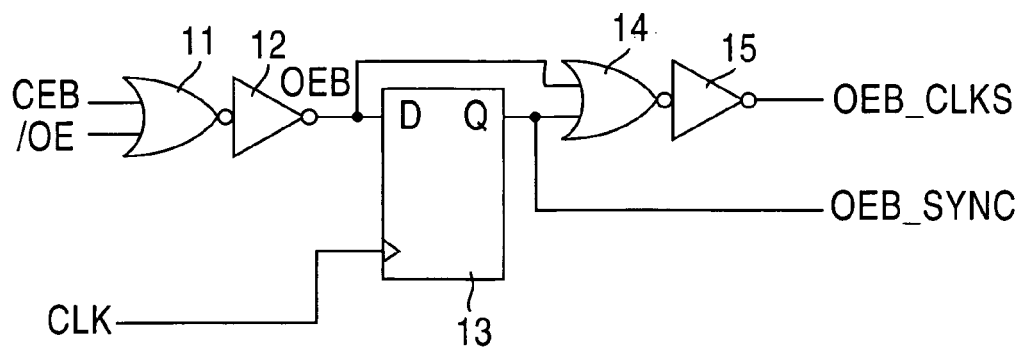
FIG. 2 is a circuit diagram showing a first example of a synchronizing circuit.

FIG. 2 is a first example of the synchronizing circuit 1. A NOR gate 11 which receives a chip enable signal CEB and an output enable signal /OE is connected with an inverter gate 12 and an internal output enable signal OEB is outputted from an output terminal of the inverter gate 12. The output terminal of the inverter gate 12 is connected with a data input terminal (D) of a flip-flop circuit 13 and one input terminal of the NOR gate 14. The flip-flop circuit 13 is synchronously controlled by a clock signal CLK and its output terminal (Q) outputs a synchronized output enable signal OEB_SYNC and is connected with the other input terminal of the NOR gate 14. The NOR gate 14 outputs an internal clock control signal OEB_CLKS through an inverter gate 15.

When the chip enable signal CEB is active at low level, the NOR gate 11 has a logical inversion function and an internal output enable signal OEB as a same phase signal for the output enable signal /OE is acquired. The internal output enable signal OEB is introduced into the flip-flop circuit 13 and synchronized with the next cycle clock signal CLK to output a synchronized output enable signal OEB_SYNC as a same phase signal. Therefore, the synchronized output enable signal OEB_SYNC is a same phase signal for the output enable signal /OE and acquired as a signal synchronized with the clock signal CLK. Furthermore, the NOR gate 14 and the inverter gate 15 output an internal clock control signal OEB_CLKS as an OR signal (logical addition) of the internal output enable signal OEB and synchronized output enable signal OEB_SYNC.

Here, the output enable signal /OE which represents the suspend mode is high. As the output enable signal /OE goes high asynchronously with the clock signal CLK, the internal output enable signal OEB also goes high. The synchronized output enable signal OEB_SYNC goes high synchronously with clock signals CLK in the next and subsequent cycles. For entry into the suspend mode, the internal output enable signal OEB goes high before low-to-high transition of the synchronized output enable signal OEB_SYNC, which leads to low-to-high transition of the internal clock control signal OEB_CLKS. On the other hand, for exit from the suspend mode, the synchronized output enable signal OEB_SYNC goes low in synchronization with clock signals CLK in the next and subsequent cycles after high-to-low transition of the internal output enable signal OEB. Hence, high-to-low transition of the synchronized output enable signal OEB_SYNC leads to high-to-low transition of the internal clock control signal OEB_CLKS.

Figure 3:
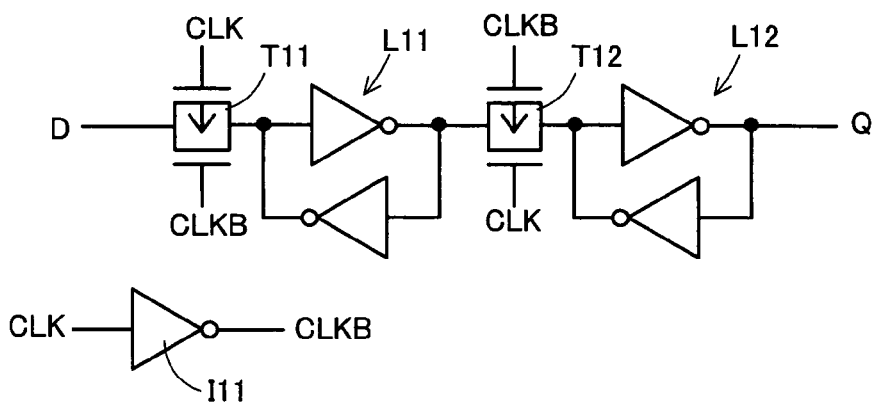
FIG. 3 is a circuit diagram showing an example of a flip-flop circuit.

FIG. 3 shows a concrete example of the flip-flop circuit 13. An inverter gate I11 generates an inversion signal CLKB for a clock signal CLK. The data input terminal (D) is synchronously controlled by complementary clock signals CLK and CLKB and connected to a latch circuit L11 through a transfer gate T11 whose conductivity is controlled by a low clock signal CLK. The output of the latch circuit L11 is synchronously controlled by the complementary clock signals CLK and CLKB and connected to a latch circuit L12 through a transfer gate T12 whose conductivity is controlled by a high clock signal CLK. The output of the latch circuit L12 is connected to an output terminal (Q).

In the last half of a clock cycle when the clock signal CLK is low, a signal is entered through the data input terminal (D) and latched by the latch circuit L11. As the clock signal CLK goes high and the next clock cycle begins, the signal latched by the latch circuit L11 is transmitted to the latch circuit L12 and outputted through the output terminal (Q). Consequently, the signal is outputted in synchronization with the start of a clock cycle of the clock signal CLK and the signal which enters through the data input terminal (D) is thus synchronized.

Figure 4:
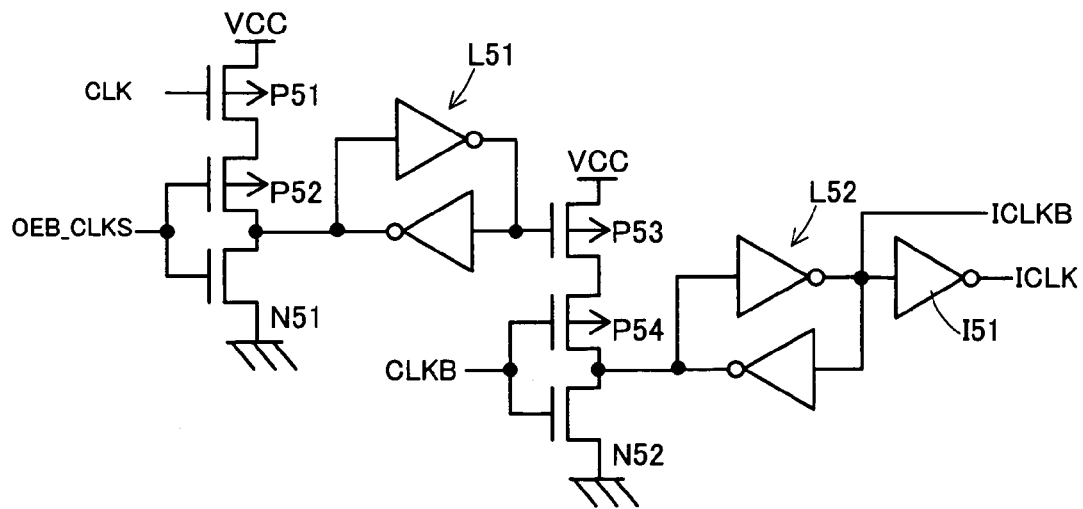
FIG. 4 is a circuit diagram showing an example of a clock control circuit.

FIG. 4 shows a concrete example of the clock control circuit 5. This circuit has two latch circuits L51 and L52. The signal is sent to the latch circuits L51 and L52 through transistors connected in series from supply voltage VCC to ground voltage (PMOS transistors P51 and P52, NMOS transistor N51, PMOS transistors P53 and P54, and NMOS transistor N52).

The clock signal CLK enters the gate terminal of the PMOS transistor P51 and the internal clock control signal OEB_CLKS is connected with the gate terminals of the PMOS transistor P52 and NMOS transistor N51. The gate terminal of the PMOS transistor P53 is connected with an output terminal (NN1) of the latch circuit L51 and an inverted clock signal CLKB enters the gate terminals of the PMOS transistor P54 and NMOS transistor N52.

For burst reading, when the internal clock control signal OEB_CLKS is low and the clock signal CLK in the last half of the clock cycle becomes low, a "high" signal is introduced into the latch circuit L51 and a "low" signal is outputted from the output terminal (NN1). The latch circuit L51 latches this state. The PMOS transistor P53 becomes conductive and the PMOS transistor P54 and NMOS transistor N52 invert the inverted clock signal CLKB, so that a same phase signal for the clock signal is introduced into the latch circuit L52. In the latch circuit L52, the signal level is inverted again and outputted. This signal is outputted as an inverted internal clock signal ICLKB and outputted through an inverter gate I51 as an internal clock signal ICLK.

In the suspend mode, the internal clock control signal OEB_CLKS is high. The PMOS transistor P52 is nonconductive, and the NMOS transistor N51 is conductive. The latch circuit L51 receives a "low" signal and the output terminal (NN1) outputs a "high" signal. Upon receipt of this signal, the PMOS transistor P53 becomes nonconductive. The latch circuit L52 receives a "low" signal according to a "high" inverted clock signal CLKB and latches it. The internal clock signal ICLK is fixed at low level.

The internal clock signals ICLK and ICLKB are stopped during the period from the next clock cycle after low-to-high transition of the output enable signal /OE leads to low-to-high transition of the internal clock control signal OEB_CLKS, until high-to-low transition of the synchronized output enable signal OEB_SYNC leads to high-to-low transition of the internal clock control signal OEB_CLKS.

It is needless to say that if a flip-flop circuit is inserted in the clock signal transmission line from the inverted clock signal CLKB to the internal clock signals ICLK and ICLKB, the latency from entry into the suspend mode until stop of the internal clock signal, and from exit from the suspend mode to resumption of internal clock signal operation can be adjusted.

Figure 5:
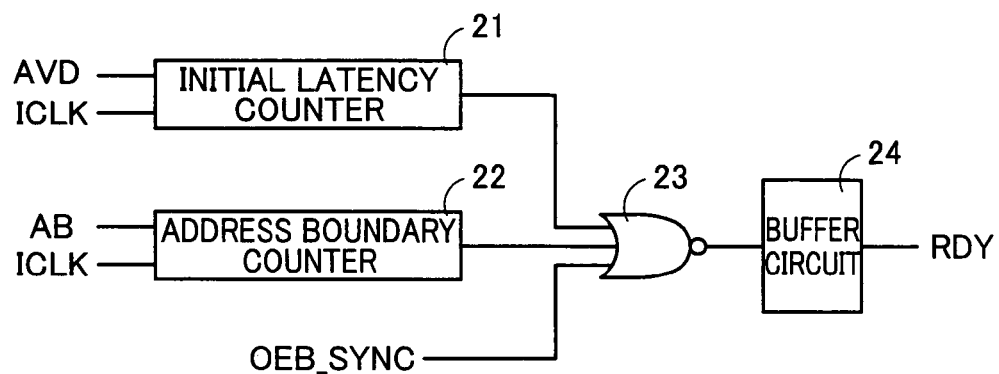
FIG. 5 is a circuit diagram showing an example of a ready control circuit.

FIG. 5 shows a concrete example of the ready control circuit 2. A ready signal RDY, which is outputted through the buffer circuit 24, is outputted by an OR circuit 23 in the following three cases.

The first is a case that the output enable signal /OE causes suspend mode transition. When entry into the suspend mode (or exit from the suspend mode) causes the output enable signal /OE to go high (or low), the synchronized output enable signal OEB_SYNC also goes high (or low) in synchronization with the clock signal CLK. This signal is outputted as a low (or high) ready signal RDY through the OR circuit 23 and buffer circuit 24. Output of the ready signal RDY is controlled in synchronization with the synchronized output enable signal OEB_SYNC. Since the synchronized output enable signal OEB_SYNC is outputted after an operation cycle of a clock signal CLK as determined by transition of the output enable signal /OE, the ready signal RDY is outputted at the time determined by transition of the output enable signal /OE.

The second is a case that at the start of a burst mode, latency as a waiting time from receipt of an initial address Add to output of initial data is controlled so as to notify that output data in this period is invalid. An initial latency counter 21 which receives an internal clock signal ICLK and an address latch signal AVD counts prescribed clock cycles for control.

The third is a case that in a burst mode where addresses are sequentially changed, when, in response to address change, access is shifted to inactive areas such as word lines not selected/activated, latency as a waiting time until active areas are changed and data is outputted from a new area is controlled so as to notify that output data in this period is invalid. An address boundary counter 22 which receives an internal clock signal ICLK and an address boundary signal AB counts prescribed clock cycles in response to address boundary signals AB.

Figure 6:
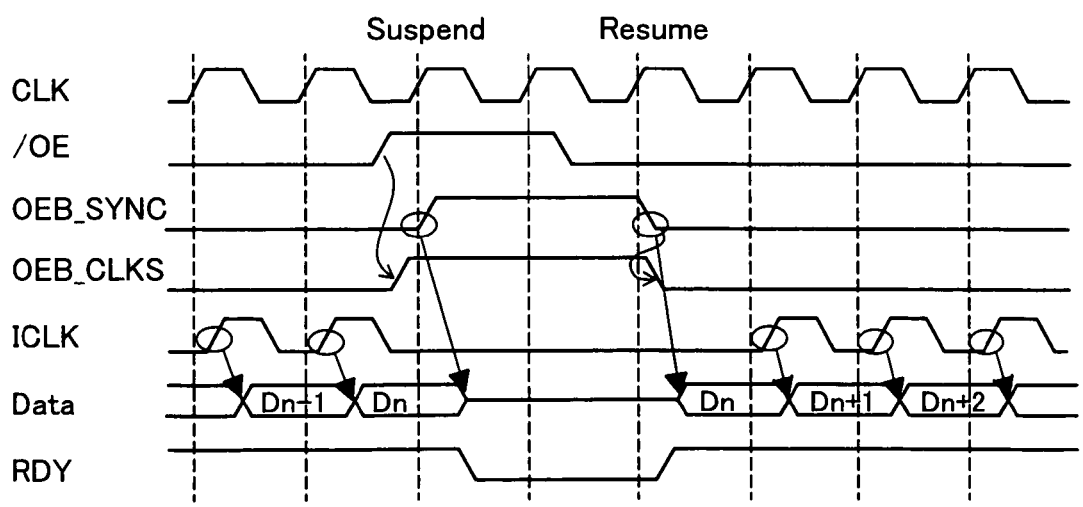
FIG. 6 is a first waveform chart according to an embodiment of the present invention (latency: 0)

FIG. 6 shows waveforms where no latency is set (latency 0) in connection with output control of data and ready signal RDY for entry into (or exit from) the suspend mode. As the output enable signal /OE goes high, the suspend mode is entered in the next clock cycle. When the internal clock control signal OEB_CLKS goes high before start of a clock cycle, the internal clock signal ICLK is stopped. When the synchronized output enable signal OEB_SYNC goes high in the clock cycle for entry into the suspend mode, output of data Dn is disabled and the data terminal (DATA) goes into a high impedance state and the ready signal RDY goes low to notify that the semiconductor memory device has entered the suspend mode.

When the output enable signal /OE goes low, the suspend mode is exited (entry into the resume mode) in the next clock cycle. As the synchronized output enable signal OEB_SYNC goes low, output of data Dn is resumed and the ready signal. RDY goes high to notify that the semiconductor memory device has exited the suspend mode. The internal clock signal ICLK resumes operation in the next clock cycle in response to the internal clock control signal OEB_CLKS which goes low with the clock cycle for exit from the suspend mode. In the clock cycle for exit from the suspend mode, there is no transition of an internal address AD by the burst counter 8 and data Dn at the time of entry into the suspend mode is outputted.

Figure 7:
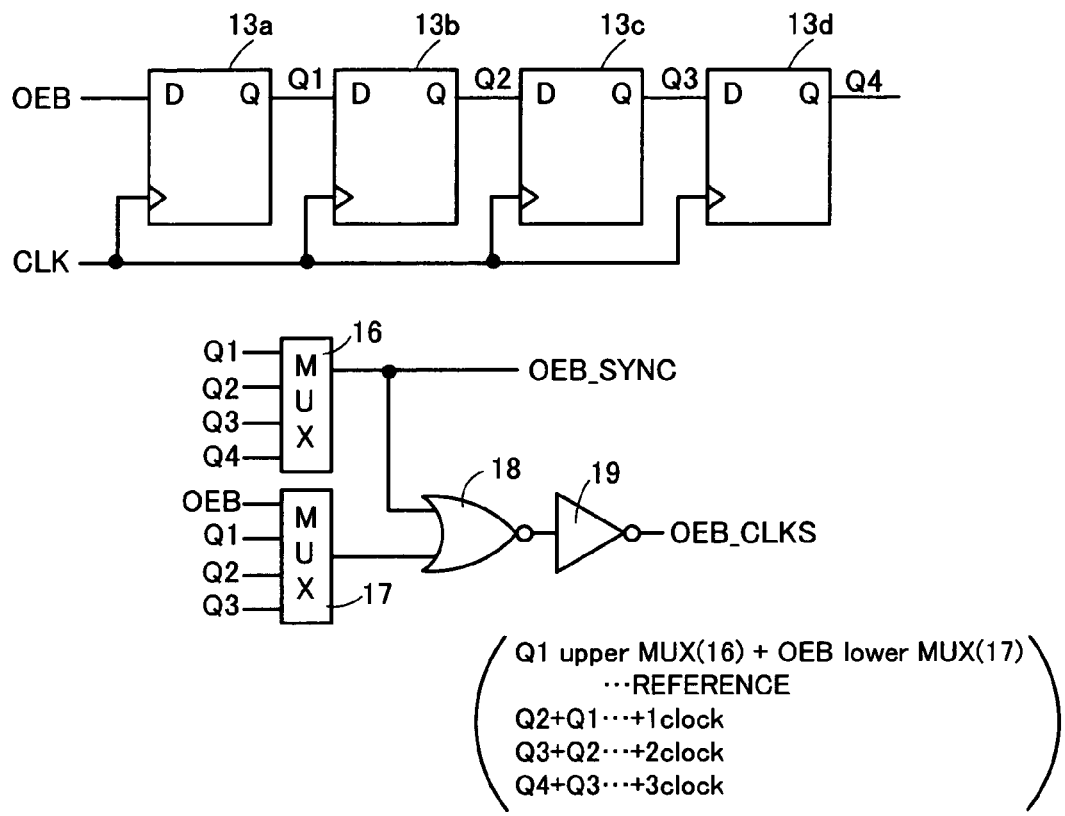
FIG. 7 is a circuit diagram showing a second example of a synchronizing circuit.

FIG. 7 shows a second example of the synchronizing circuit 1. In the first example (FIG. 2), data output is prohibited (or resumed) and the ready signal RDY goes low (or high) in the next cycle after entry into the suspend mode (or exit from the suspend mode) (latency 0). In the second example, instead, latency in the period from entry into (or exit from) the suspend mode until prohibition (or resumption) of data output and "low" (or "high") output of the ready signal RDY can be adjusted. Flip-flop circuits 13a to 13d and multiplexers 16 and 17 are used instead of the flip-flop circuit 13 in the first example (FIG. 2).

The flip-flop circuits 13a to 13d which are controlled by a clock signal CLK work as follows. The flip-flop circuit 13a receives an internal output enable signal OEB through its data input terminal (D) and its output terminal (Q) is connected with a data input terminal (D) of the flip-flop circuit 13b. The output terminals (Q) and data input terminals (D) of the other flip-flop circuits are connected in series sequentially in a similar manner. Output signals Q1 to Q4 from the output terminals (Q) of the flip-flop circuits 13a to 13d enter the mulitplexer 16 while the internal output enable signal OEB and output signals Q1 to Q3 enter the multiplexer 17.

The multiplexers 16 and 17 select one input signal according to a latency adjustment signal (not shown) and outputs the selected signal. Combinations of signals selected by the multiplexers 16 and 17 are (Q1, OEB), (Q2, Q1) (Q3, Q2), and (Q4, Q3) which correspond to latency 0 to latency 3 respectively. Since the internal output enable signal OEB is sequentially transmitted from the flip-flop circuit 13a to the flip-flop circuit 13d in each clock cycle, latency is set as necessary by selection of input/output signals through the flip-flop circuits 13a to 13d. Although the structure shown in FIG. 7 uses four flip-flop circuits 13a to 13d to set latencies 0 to 3, latency 4 or a higher latency may be set by serial connection of additional flip-flop circuits.

Figure 8:
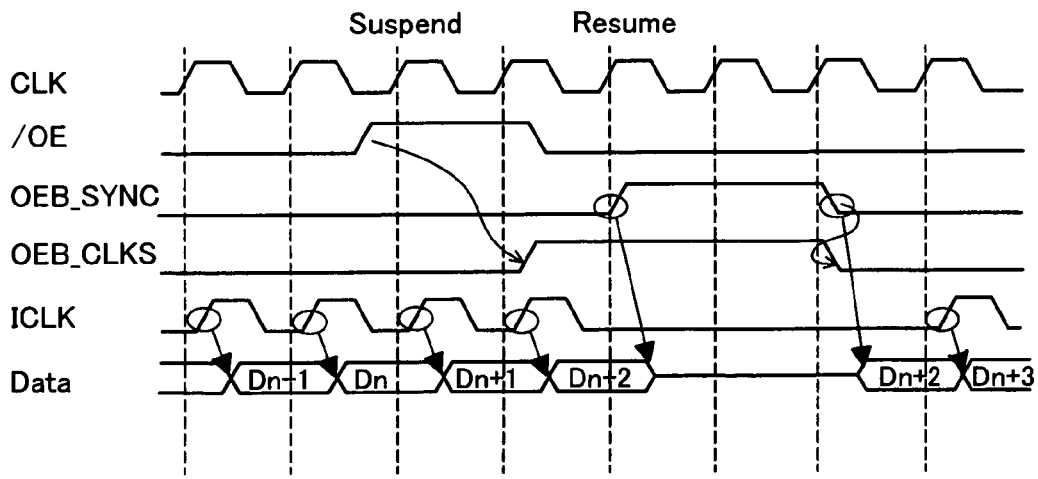
FIG. 8 is a second waveform chart according to an embodiment of the present invention (latency: 2)
Figure 9:
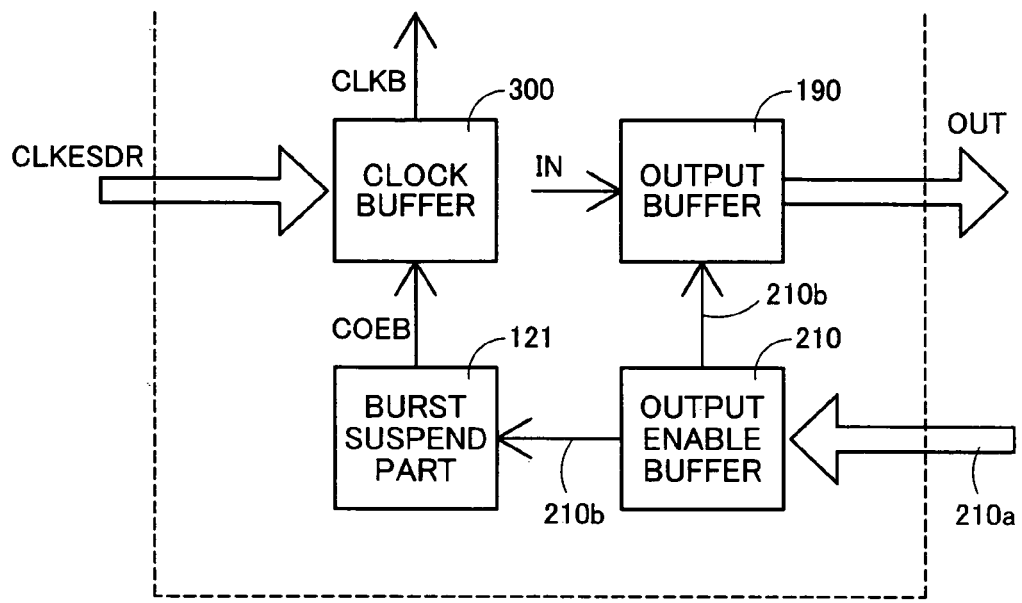
FIG. 9 is a circuit block diagram showing the key part of the prior art.
Figure 10:
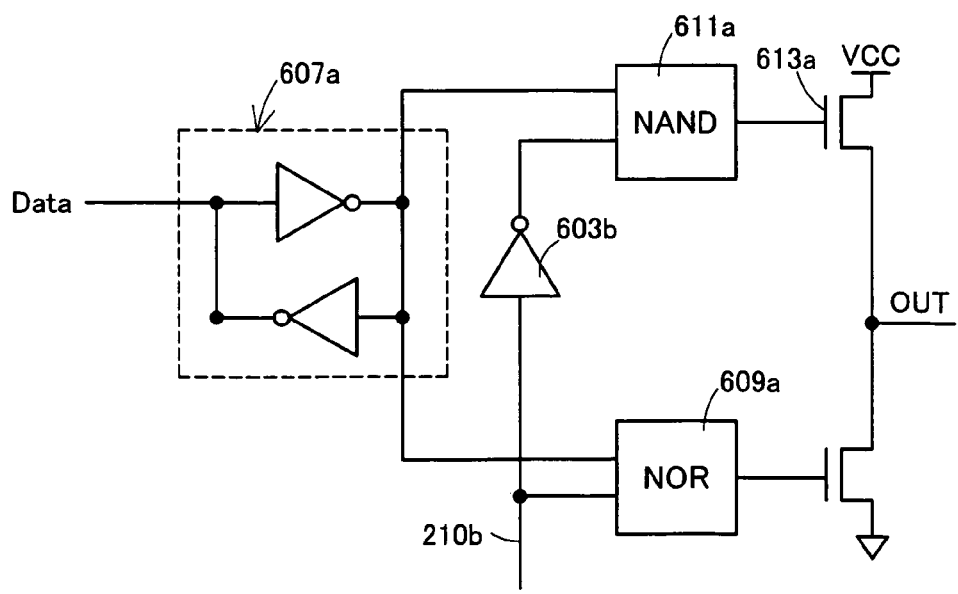
FIG. 10 is a circuit diagram showing an output buffer circuit in the prior art.

FIG. 8 shows waveforms where latency 2 is set by the synchronizing circuit in the second example (FIG. 7). In the third clock cycle after level transition of the output enable signal /OE, level transition of the synchronized output enable signal OEB_SYNC occurs. Since output of data and ready signal RDY due to entry into (exit from) the suspend mode is disabled or enabled by the synchronized output enable signal OEB_SYNC, data output is prohibited (or resumed) and transition of the ready signal RDY to "low" (or "high") level is done in the third clock cycle after level transition of the output enable signal /OE. Here, the latency is adjusted to 2.

As explained so far, in the semiconductor memory device and the semiconductor memory device control method according to this embodiment, an output enable signal /OE as an output control signal is entered asynchronously with an external clock signal extCLK as an external control signal and even when an instruction to start or end the suspend mode is given (entry into the suspend mode or exit from the suspend mode), transition from a mode which enables data output to a mode which disables data output or vice versa is made in synchronization with the external clock signal extCLK. Data output enabled and disabled states are switched at the time of input of an external clock signal extCLK which is uniquely determined by a suspend instruction through an output enable signal /OE, so that quick and stable operation is assured. Since data output state switching is controlled in synchronization with the external clock signal extCLK, stable operation is assured even when the external clock signal extCLK operation cycle is sped up.

Also, a ready signal RDY, a notification signal synchronized with the external clock signal extCLK, notifies an external device such as a system controller that data output enabled and disabled states have been changed with suspend mode transition. The time of notification by the ready signal RDY and the time of data output state switching are synchronized with the same external clock signal extCLK. Therefore, at the time of input of an external clock signal extCLK (which is uniquely determined by a suspend instruction through an output enable signal /OE), not only data output enabled and disabled states are switched but also a ready signal RDY is outputted quickly and stably. Since control is done synchronously with the external clock signal extCLK, stable operation is assured even when the external clock signal extCLK operation cycle is sped up.

The time of suspend mode transition is notified at the time of input of an external clock signal extCLK which is uniquely determined by a suspend instruction through an output enable signal /OE. Because a ready signal RDY is generated at a given time in synchronization with the external clock signal extCLK, in a system configuration in which a system bus is shared among plural devices (including a semiconductor memory device according to the present invention), the time to change the device connected with the system bus for data transmission can be notified accurately. This eliminates the possibility that, because the time of transition to the data output disabled state is unknown, another device might be connected with the system bus before data output state transition, resulting in a bus fight in the system bus. Hence, the device connected with the system bus can be switched to another device stably and quickly.

In addition, data output state transition or output of ready signal RDY according to a suspend instruction can be done with an output latency added in units of cycles of an external clock signal extCLK so that an adjustment can be flexibly made to suit an external system.

The present invention is not limited to the above embodiment and may be embodied in other varied or modified forms without departing from the spirit thereof.

The above embodiment has been described in connection with burst reading in a synchronous semiconductor memory device which uses, for example, an external clock signal extCLK as an external control signal. However, the invention is not limited thereto. The invention can be applied to an asynchronous semiconductor memory device which uses a /CAS signal or the like instead of an external clock signal extCLK.

According to the present invention, in a semiconductor memory device and a semiconductor memory device control method, even when an output control signal which controls data output and performs a suspend/resume function is entered asynchronously with an external control signal in continuous data reading (burst reading, etc), output control to suspend or resume data output is synchronized with an external control signal and a notification signal which notifies whether the suspend mode is entered or not is also synchronized as in data output control.

What is claimed is:

1. A semiconductor memory device which continuously outputs data in synchronization with an external control signal, comprising:
    an output control terminal which receives an output control signal which functions as both a data output control instruction and a suspend instruction for continuous data output;
    a synchronizing circuit, connected with the output control terminal, which acquires the output control signal in synchronization with the external control signal and outputs the acquired signal as a synchronized output control signal; and
    an output buffer circuit which synchronously controls whether to enable or disable data output according to the synchronized output control signal.

2. The semiconductor memory device as claimed in claim 1, further comprising:
    a notification terminal which outputs a notification signal to notify whether output data is valid or invalid according to the suspend instruction; and
    a notification circuit, connected with the notification terminal, which synchronously controls the notification signal according to the synchronized output control signal.

3. The semiconductor memory device as claimed in claim 1, wherein
    the synchronizing circuit includes a flip-flop circuit which is used to acquire the output control signal in synchronization with the external control signal.

4. The semiconductor memory device as claimed in claim 3, wherein
    the synchronizing circuit includes one or more flip-flop circuits which are used to adjust an output latency of the synchronized output control signal.

5. A method of controlling a semiconductor memory device which continuously outputs data in synchronization with an external control signal, comprising the steps of:
    acquiring an output control signal which functions as both a data output control instruction and a suspend instruction for continuous data output, in synchronization with the external control signal; and
    synchronously controlling whether to enable or disable data output according to the acquired output control signal.

6. The semiconductor memory device control method as claimed in claim 5, further comprising the step of:
    notifying whether output data is valid or invalid, according to the suspend instruction through the output control signal acquired synchronously with the external control signal.

7. The semiconductor memory device control method as claimed in claim 6, further comprising the step of:
acquiring a delayed output control signal which is delayed in units of operation cycles of the external control signal, with respect to the output control signal,
wherein the step of notifying is carried out.

8. The semiconductor memory device control method as claimed in claim 5, further comprising the step of:
acquiring a delayed output control signal which is delayed in units of operation cycles of the external control signal, with respect to the output control signal,
wherein the step of synchronously controlling is carried out.

* * * * *